(12) United States Patent
Ju et al.

(10) Patent No.: US 11,362,297 B2
(45) Date of Patent: Jun. 14, 2022

(54) DISPLAY DEVICE

(71) Applicant: Samsung Display Co., Ltd., Yongin-si (KR)

(72) Inventors: Yongchan Ju, Yongin-si (KR); Yisu Kim, Seoul (KR); Jongwoo Kim, Hwaseong-si (KR); Eung Seok Park, Seoul (KR); Wonmin Yun, Yongin-si (KR); Jaeheung Ha, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 45 days.

(21) Appl. No.: 16/662,903

(22) Filed: Oct. 24, 2019

(65) Prior Publication Data

US 2020/0266371 A1     Aug. 20, 2020

(30) Foreign Application Priority Data

Feb. 18, 2019    (KR) .................. 10-2019-0018639

(51) Int. Cl.
     *H01L 33/00*        (2010.01)
     *H01L 51/50*        (2006.01)
     (Continued)

(52) U.S. Cl.
     CPC .......... *H01L 51/502* (2013.01); *H01L 27/322* (2013.01); *H01L 51/5268* (2013.01);
     (Continued)

(58) Field of Classification Search
     CPC ... H01L 27/322; H01L 27/3244; H01L 33/16; H01L 33/18; H01L 33/26; H01L 33/34;
     (Continued)

(56) References Cited

U.S. PATENT DOCUMENTS 4,695,859 A * 9/1987 Guha ................ H01L 27/14609
                                              250/551
6,515,310 B2 * 2/2003 Yamazaki ........... H01L 51/5281
                                              257/257
(Continued)

FOREIGN PATENT DOCUMENTS

JP      WO 2018/163955    *   9/2018 ............. G09K 11/65
KR      10-1486507 B1      1/2015
(Continued)

OTHER PUBLICATIONS

Xiaoming Li, et al., "Carbon and Graphene Quantum Dots for Optoelectronic and Energy Devices: A Review," Advanced Functional Materials, 25, 2015, www.wileyonlinelibrary.com, pp. 4929-4947.

(Continued)

*Primary Examiner* — Jay C Kim
(74) *Attorney, Agent, or Firm* — Lewis Roca Rothgerber Christie LLP

(57) ABSTRACT

Provided is a display device. The display device includes a light emitting element layer including a plurality of light emitting elements, and a light control layer on the light emitting element layer and overlapping the light emitting element layer on a plane. At least one of the light emitting elements and the light control layer includes an amorphous carbon light emitter.

8 Claims, 10 Drawing Sheets

(51) Int. Cl.
*H01L 27/32* (2006.01)
*H01L 51/52* (2006.01)

(52) U.S. Cl.
CPC .... *H01L 27/3244* (2013.01); *H01L 2251/301* (2013.01); *H01L 2251/5369* (2013.01); *H01L 2251/558* (2013.01)

(58) Field of Classification Search
CPC ............... H01L 51/502; H01L 51/5268; H01L 2251/301; H01L 2251/5369; H01L 2251/558
See application file for complete search history.

(56) References Cited

U.S. PATENT DOCUMENTS

| | | | |
|---|---|---|---|
| 6,586,775 B2 * | 7/2003 | Hirayama | B82Y 20/00 257/103 |
| 6,956,324 B2 * | 10/2005 | Yamazaki | H01L 51/52 313/498 |
| 7,038,374 B2 * | 5/2006 | Yamazaki | H01L 51/529 313/504 |
| 7,622,863 B2 * | 11/2009 | Seo | G09G 3/3216 257/100 |
| 7,728,516 B2 * | 6/2010 | Kawaguchi | H01L 27/322 313/506 |
| 7,897,976 B2 * | 3/2011 | Kawazoe | H01L 33/0041 257/79 |
| 8,063,549 B2 * | 11/2011 | Nagao | H01L 21/02573 313/498 |
| 8,110,825 B2 * | 2/2012 | Obata | H01L 27/3246 257/40 |
| 8,124,967 B2 * | 2/2012 | Iizumi | H01L 51/56 257/40 |
| 8,258,508 B2 * | 9/2012 | Matsuura | H01L 51/0045 257/40 |
| 8,269,410 B2 * | 9/2012 | Kijima | C09K 11/7788 313/501 |
| 8,431,448 B2 * | 4/2013 | Obata | H01L 51/055 438/151 |
| 8,563,970 B2 * | 10/2013 | Choi | H05K 9/0096 257/40 |
| 8,969,862 B2 * | 3/2015 | Otsuki | H01L 51/008 257/40 |
| 9,000,419 B2 * | 4/2015 | Iizumi | H01L 51/5012 257/40 |
| 9,099,598 B2 * | 8/2015 | Imai | H01L 33/62 |
| 9,257,664 B2 * | 2/2016 | Ito | H01L 51/002 |
| 9,490,454 B2 * | 11/2016 | Pei | H01L 51/5268 |
| 9,691,831 B2 * | 6/2017 | Sato | H01L 51/524 |
| 9,929,228 B2 * | 3/2018 | Ono | H01L 51/5072 |
| 9,947,897 B2 * | 4/2018 | Kamiya | H01L 27/3276 |
| 10,074,308 B2 * | 9/2018 | Ono | G09G 3/3233 |
| 10,163,988 B2 * | 12/2018 | Sun | H01L 51/5088 |
| 10,205,129 B2 * | 2/2019 | Xu | H01L 27/3213 |
| 10,312,306 B2 * | 6/2019 | Kim | H01L 27/3246 |
| 10,334,685 B2 * | 6/2019 | Yu | H05B 45/20 |
| 10,381,419 B2 * | 8/2019 | Lee | H01L 51/5246 |
| 10,818,856 B2 * | 10/2020 | Xie | H01L 51/0566 |
| 2006/0087228 A1 * | 4/2006 | Kobayashi | H01L 51/56 313/504 |
| 2006/0261350 A1 * | 11/2006 | Kawazoe | H01L 33/025 257/79 |
| 2007/0003743 A1 * | 1/2007 | Asano | B82Y 30/00 428/201 |
| 2007/0248746 A1 * | 10/2007 | Ito | H01L 51/0004 427/64 |
| 2015/0218001 A1 * | 8/2015 | Wang | G01N 33/588 424/9.6 |
| 2016/0064681 A1 | 3/2016 | Lee et al. | |
| 2017/0058199 A1 | 3/2017 | Jang et al. | |
| 2018/0366673 A1 * | 12/2018 | Xie | H01L 51/56 |
| 2019/0344516 A1 * | 11/2019 | Maruyama | G02B 3/0012 |
| 2019/0373147 A1 * | 12/2019 | Yamamoto | H04N 5/2254 |
| 2020/0048548 A1 * | 2/2020 | Nagao | A01G 7/00 |

FOREIGN PATENT DOCUMENTS

| | | |
|---|---|---|
| KR | 10-2016-0025337 A | 3/2016 |
| KR | 10-2017-0026963 A | 3/2017 |

OTHER PUBLICATIONS

Xin Ting Zheng, et al., "Glowing Graphene Quantum Dots and Carbon Dots: Properties, Syntheses, and Biological Applications," Small, vol. 11, No. 14, 2015, www.small-journal.com, pp. 1620-1636.

Yuxing Yang, et al., "Bottom-up fabrication of photoluminescent carbon dots with uniform morphology via a soft-hard template approach," The Royal Society of Chemistry, 49, 2013, pp. 4920-4922.

Woosung Kwon, et al., "Freestanding Luminescent Films of Nitrogen-Rich Carbon Nanodots toward Large-Scale Phosphor-Based White-Light-Emitting Devices," American Chemical Society, Chem. Mater, 25, 2013, pp. 1893-1899.

Xiaoyu Zhang, et al., "Color-Switchable Electroluminescence of Carbon Dot Light-Emitting Diodes," American Chemical Society, vol. 7, No. 12, 2013, pp. 11234-11241.

Mahasin Alam Sk, et al., "Revealing the tunable photoluminescence properties of graphene quantum dots," Journal of Materials Chemistry C, 2, 2014, pp. 6954-6960.

Youfu Wang, et al., "Carbon Quantum dots: synthesis, properties and applications," Journal of Materials Chemistry C, 2, 2014, pp. 6921-6939.

* cited by examiner

DISPLAY DEVICE

CROSS-REFERENCE TO RELATED APPLICATIONS

This application claims priority to and the benefit of Korean Patent Application No. 10-2019-0018639, filed on Feb. 18, 2019, the entire content of which is hereby incorporated by reference.

BACKGROUND

1. Field

Embodiments of the present disclosure herein relate to a display device including a quantum dot light emitter, and, for example, to a display device including a quantum dot light emitter formed of amorphous carbon.

2. Description of the Related Art

Various display devices used for multimedia devices such as televisions, mobile phones, tablet computers, navigation systems, and game consoles are being developed.

In order to improve the color reproducibility and viewing angle of the display, a display device including a light control layer including a quantum dot light emitter has been developed. Furthermore, in order to realize long life and high color reproducibility, a self-light emitting display device using a quantum dot luminescent material as a luminescent material has been developed.

However, in the case of a quantum dot luminescent material including cadmium, there has been a limitation with environmental pollution. Additionally, in the case of a Quantum dot luminescent material not including cadmium, it was difficult to realize blue light. Recently, research for improving display devices has been actively in progress.

SUMMARY

Embodiments of the present disclosure provide a display device including an environmentally friendly amorphous carbon light emitter.

Embodiments of the present disclosure also provide a display device including an amorphous carbon light emitter capable of emitting blue light.

An embodiment of the present disclosure provides a display device including: a light emitting element layer including a plurality of light emitting elements; and a light control layer on the light emitting element layer and overlapping the light emitting element layer on a plane, wherein at least one of the light emitting elements and the light control layer includes an amorphous carbon light emitter.

In an embodiment, each of the light emitting elements may include a light emitting layer, wherein the light emitting layer may include the amorphous carbon light emitter.

In an embodiment, each of the light emitting elements may include: a first electrode; a hole transport area on the first electrode; a light emitting layer on the hole transport area; an electron transport area on the light emitting layer; and a second electrode on the electron transport area, wherein the light emitting layer may include the amorphous carbon light emitter.

In an embodiment, the light emitting elements may include a first light emitting element emitting a first color light, a second light emitting element emitting a second color light, and a third light emitting element emitting a third color light.

In an embodiment, the first light emitting element may include a first amorphous carbon light emitter having a size of 1.50 nm or more to 1.65 nm or less.

In an embodiment, the second light emitting element may include a second amorphous carbon light emitter having a size of 1.66 nm or more to 2.00 nm or less, and the third light emitting element may include a third amorphous carbon light emitter having a size of 2.10 nm or more to 3.00 nm or less.

In an embodiment, the first color light may be blue light, the second color light may be green light, and the third color light may be red light.

In an embodiment, the light control layer may include a base resin and the amorphous carbon light emitter dispersed in the base resin.

In an embodiment, the light emitting elements may emit a first color light, wherein the light control layer may include: a first light control part transmit the first color light; a second light control part absorb the first color light and emit a second color light; and a third light control part absorb the first color light and emit a third color light.

In an embodiment, the first light control part may include a base resin and a scatterer dispersed in the base resin, wherein the second light control part may include a second amorphous carbon light emitter for emitting a second color light by changing a wavelength of the first color light, wherein the third light control part may include a third amorphous carbon light emitter for emitting a third color light by changing the wavelength of the first color light.

In an embodiment, each of the light emitting elements may include: a first electrode; a light emitting layer on the first electrode; and a second electrode on the light emitting layer, wherein the light emitting layer may be a common layer on the light emitting elements.

In an embodiment, the display device may further include: a first color filter on the first light control part and overlapping the first light control part on a plane; a second color filter on the second light control part and overlapping the second light control part on a plane; and a third color filter on the third light control part and overlapping the third light control part on a plane.

In an embodiment, each of the light emitting elements may include a light emitting layer, wherein the light emitting layer may include the amorphous carbon light emitter, wherein the light control layer may include a base resin and the amorphous carbon light emitter dispersed in the base resin.

In an embodiment of the present disclosure, a display device includes a plurality of light emitting elements, each of the light emitting elements including: a first electrode; a hole transport area on the first electrode; a light emitting layer on the hole transport area; an electron transport area on the light emitting layer, and a second electrode on the electron transport area, wherein at least one of the light emitting elements includes an amorphous carbon light emitter in the light emitting layer.

In an embodiment, the light emitting elements may include a first light emitting element emitting a first color light, a second light emitting element emitting a second color light, and a third light emitting element emitting a third color light.

In an embodiment, the first color light may be blue light and the light emitting layer of the first light emitting element may include the amorphous carbon light emitter.

In an embodiment, the second color light may be green light and the third color light may be red light, wherein the light emitting layer of each of the second light emitting element and the third light emitting element may include the amorphous carbon light emitter.

In an embodiment of the present disclosure, a display device includes: a display substrate including a display area and a non-display area surrounding the display area, the display area including: a first color light emitting area, a second color light emitting area, and a third color light emitting area, wherein the display substrate further includes a first light emitting element, a second light emitting element, and a third light emitting element respectively corresponding to the first color light emitting area, the second color light emitting area, and the third color light emitting area, wherein at least one of the first to third light emitting elements includes a light emitting layer including an amorphous carbon light emitter.

In an embodiment, the first light emitting element may include the amorphous carbon light emitter and emits blue light.

In an embodiment, the amorphous carbon light emitter may have a size of 1.50 nm or more and 1.65 nm or less.

BRIEF DESCRIPTION OF THE FIGURES

The accompanying drawings are included to provide a further understanding of the subject matter of the present disclosure, and are incorporated in and constitute a part of this specification. The drawings illustrate exemplary embodiments of the present disclosure and, together with the description, serve to explain principles of the present disclosure. In the drawings.

DETAILED DESCRIPTION

Figure 1:
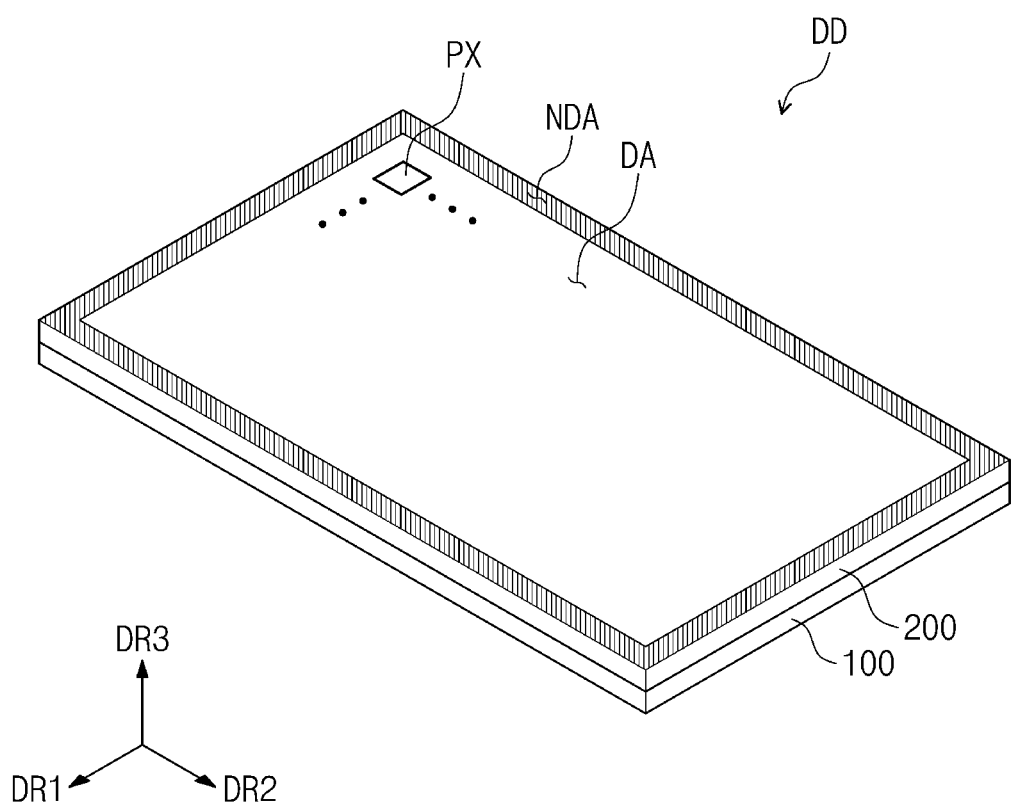
FIG. 1 is a perspective view of a display device according to an embodiment.

In this specification, when it is mentioned that a component (or, an area, a layer, a part, etc.) is referred to as being "on," "connected to," or "combined to" another component, this means that the component may be directly on, connected to, or combined to the other component or a third component therebetween may be present.

Like reference numerals refer to like elements. Additionally, in the drawings, the thicknesses, proportions, and dimensions of components may be exaggerated for effective description.

"And/or" includes all of one or more combinations defined by related components.

It will be understood that the terms "first" and "second" are used herein to describe various components, but these components should not be limited by these terms. The above terms are used only to distinguish one component from another. For example, a first component may be referred to as a second component and vice versa without departing from the spirit and scope of the present disclosure. As used herein, singular expressions include plural expressions unless the context clearly dictates otherwise.

In addition, terms such as "below", "the lower side", "on", and "the upper side" are used to describe a relationship of configurations shown in the drawing. The terms are described as a relative concept based on a direction shown in the drawing.

Unless otherwise defined, all terms (including technical and scientific terms) used herein have the same meaning as terms commonly understood by those skilled in the art to which this disclosure belongs. Also, terms such as terms defined in commonly used dictionaries should be interpreted as having meaning consistent with meaning in the context of the related art, and unless the term is interpreted in an ideal or overly formal sense, they are explicitly defined here.

In various embodiments of the present disclosure, the term "include," "comprise," "including," or "comprising," specifies a property, a region, a fixed number, a step, a process, an element and/or a component but does not exclude other properties, regions, fixed numbers, steps, processes, elements and/or components.

Hereinafter, another embodiment of the present disclosure will be described with reference to the drawings.

FIG. 1 is a perspective view of a display device DD according to an embodiment. Referring to FIG. 1, a display area DA and a non-display area NDA may be defined in the display device DD.

The display area DA may be an area where an image is displayed. The non-display area NDA may be an area where the image is not displayed. The pixels PX may be in the display area DA and the pixels PX may not be in the non-display area NDA. The pixels PX may mean effective pixels providing an image.

The display area DA is parallel (e.g., substantially parallel) to the plane defined by a first directional axis DR1 and a second directional axis DR2. The normal direction of the display area DA, for example, a thickness direction of the display device DD, is indicated by a third direction DR3. The front surface (or an upper surface) and the rear surface (or a lower surface) of each member are divided by the third direction DR3. However, the directions that the first direction DR1, the second direction DR2, and the third direction DR3 indicate may be converted to other directions as a relative concept. Hereinafter, the terms "first direction," "second direction," and "third direction" refer to the first direction DR1, the second direction DR2, and the third direction DR3, respectively.

The display device DD may be used in medium-sized electronic devices such as personal computers, notebook computers, personal digital terminals, car navigation units, game machines, portable electronic devices, and cameras in addition to large-sized electronic devices such as televisions, monitors, or external billboards. In addition, these are simply suggested as embodiments and it should be apparent that they are employed in other electronic devices without departing from the spirit and scope of the present disclosure.

A bezel area of the display device DD may be defined by the non-display area NDA. The non-display area NDA may be an area adjacent to the display area DA. The non-display area NDA may surround the display area DA. However, the present disclosure is not limited thereto, and a form of the display area DA and a form of the non-display area NDA may be designed relatively. In another embodiment of the present disclosure, the non-display area NDA may be omitted. The display device DD may include a first display substrate 100 and a second display substrate 200.

Figure 2:
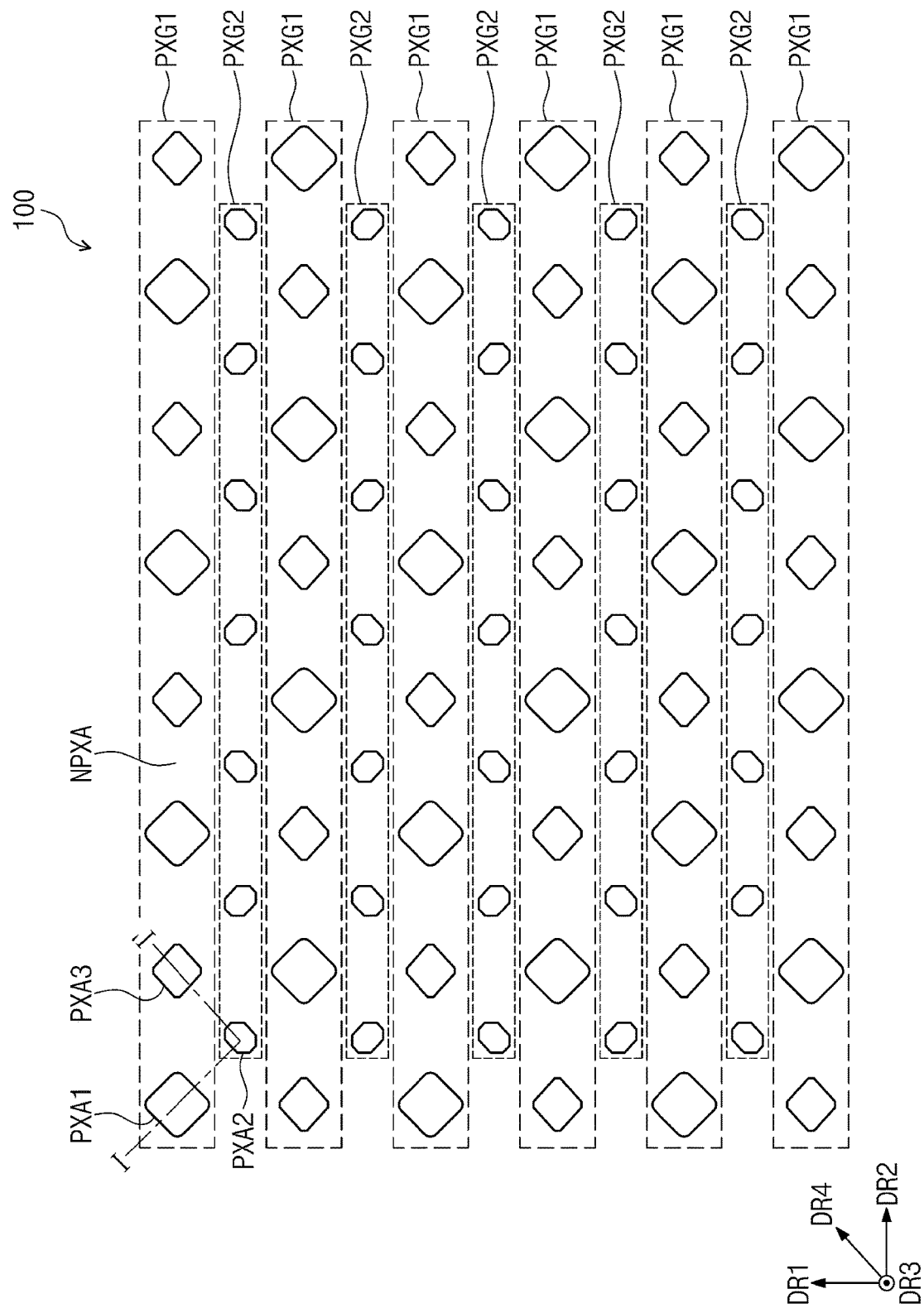
FIG. 2 is a plan view of a first display substrate according to an embodiment.
Figure 3:
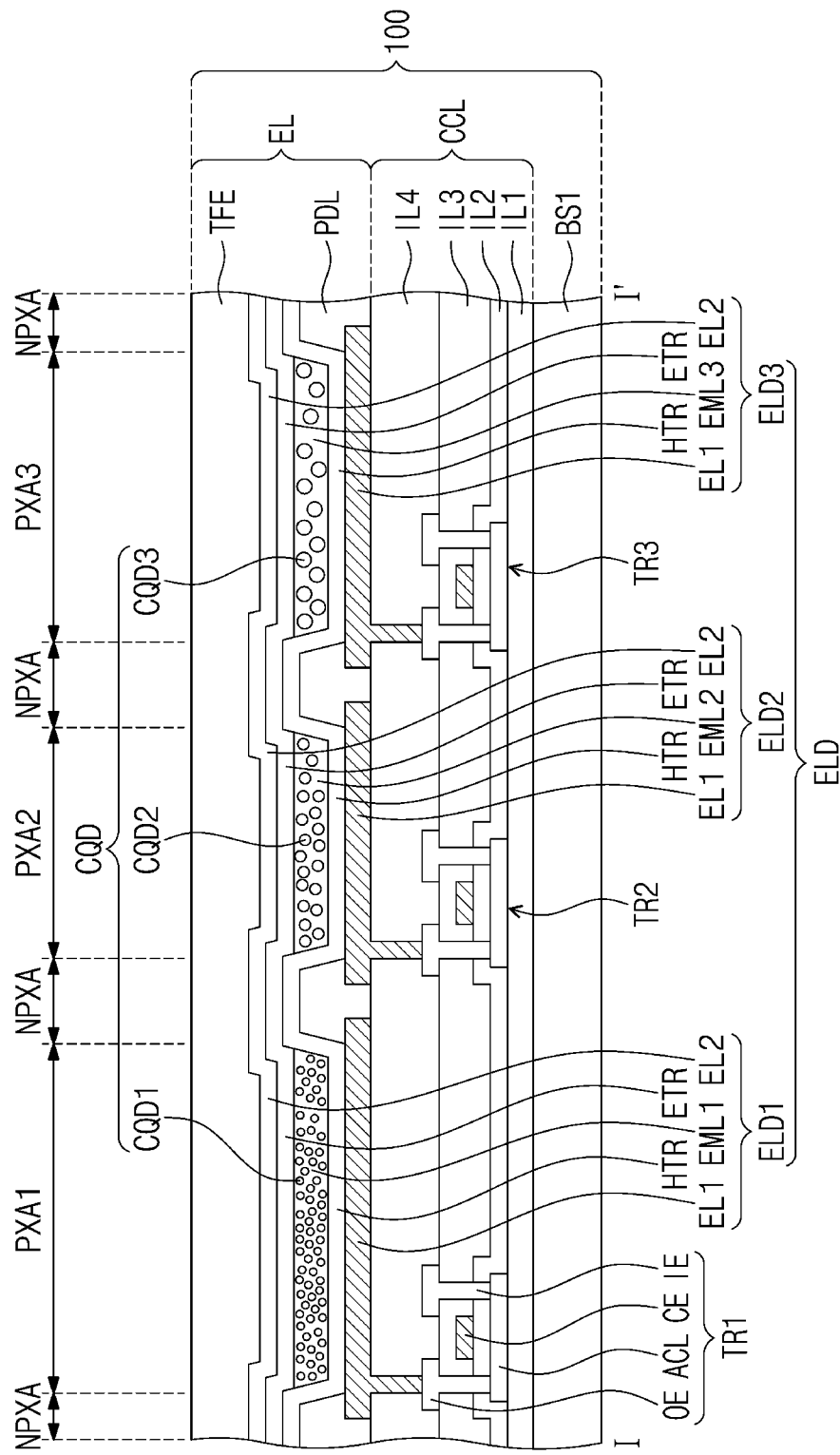
FIG. 3 is a cross-sectional view taken along the line I-I' of FIG. 2.
Figure 4:
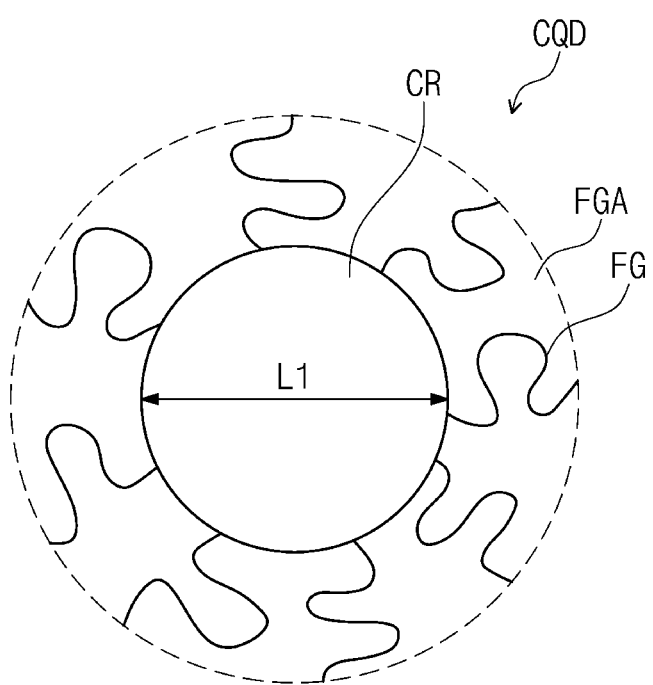
FIG. 4 is an image showing an amorphous carbon light emitter according to an embodiment.

FIG. 2 is a plan view of the first display substrate 100 according to an embodiment. FIG. 3 is a cross-sectional view taken along the line I-I' of FIG. 2. FIG. 4 is an image showing an amorphous carbon light emitter CQD according to an embodiment.

Referring to FIGS. 2 and 3, the first display substrate 100 may include a non-light emitting area NPXA and light emitting areas PXA1, PXA2, and PXA3. Each of the light emitting areas PXA1, PXA2, and PXA3 may be an area where light generated in each of the light emitting elements ELD1, ELD2, and ELD3 is emitted. The area of each of the light emitting areas PXA-R, PXA-G, and PXA-B may be different from each other, and the area may mean the area when viewed in a plan view. In this specification, "on a plane" may refer to the display device DD viewed in the third direction DR3. The light emitting areas PXA1, PXA2 and PXA3 may be divided into a plurality of groups according to the color of the light generated from the light emitting elements ELD1, ELD2 and ELD3.

The three light emitting areas PXA1, PXA2, and PXA3 for emitting the first color light, the second color light and the third color light are exemplarily shown in the first display substrate 100 of the embodiment shown in FIGS. 2 and 3. For example, the first display substrate 100 of an embodiment includes a first color light emitting area PXA1, a second color light emitting area PXA2, and a third color light emitting area PXA3, which are separated from each other. The first light emitting element ELD1 is located to correspond to the first color light emitting area PXA1 and may overlap the first color light emitting area PXA1 on a plane. The second light emitting element ELD2 is located to correspond to the second color light emitting area PXA2 and may overlap the second color light emitting area PXA2 on a plane. The third light emitting element ELD3 is located to correspond to the third color light emitting area PXA3 and may overlap the third color light emitting area PXA3 on a plane.

In an embodiment, the first display substrate 100 may include a plurality of light emitting elements ELD1, ELD2, and ELD3 that emit light in different wavelength regions. The plurality of light emitting elements ELD1, ELD2, and ELD3 may emit light of different colors from each other. For example, in an embodiment, the first display substrate 100 includes a first light emitting element ELD1 that emits blue light, a second light emitting element ELD2 that emits green light, and a third light emitting element ELD3 that emits red light. However, the embodiment is not limited thereto, and the first light emitting element ELD1, the second light emitting element ELD2, and the third light emitting element ELD3 may emit light of the same (e.g., substantially the same) wavelength range, or at least one may emit light of a different wavelength range.

In the display device DD of the embodiment shown in FIGS. 2 and 3, the light emitting areas PXA1, PXA2 and PXA3 may have different areas depending on the color emitted by the light emitting layers EML1, EML2, and EML3 of the light emitting elements ELD1, ELD2, and ELD3. For example, referring to FIGS. 2 and 3, in the first display substrate 100 of the embodiment, the first color light emitting area PXA1 of the first light emitting element ELD1 emitting the first color light may have the largest area, and the second color light emitting area PXA2 of the second light emitting element ELD emitting the second color light may have the smallest area. However, the embodiment is not limited thereto, and the light emitting areas PXA1, PXA2, and PXA3 may have the same (e.g., substantially the same) area, or the light emitting areas PXA1, PXA2, and PXA3 may be provided at different area ratios from those shown in FIG. 2.

Each of the light emitting areas PXA1, PXA2, and PXA3 may be an area defined by a pixel defining film PDL. Non-light emitting areas NPXA may be an area corresponding to the pixel defining film PDL as areas corresponding to adjacent light emitting areas PXA1, PXA2, and PXA3. On the other hand, each of the light emitting areas PXA1, PXA2, and PXA3 in this specification may correspond to a pixel.

The first color light emitting areas PXA1 and the third color light emitting areas PXA3 may be alternately arranged along the second directional axis DR2 to constitute the first group PXG1. The second color light emitting areas PXA2 may be arranged along the second directional axis DR2 to constitute the second group PXG2.

The first group PXG1 may be spaced apart from the second group PXG2 along the first directional axis DR2. Each of the first group PXG1 and the second group PXG2 may be provided in plurality. The first groups PXG1 and the second groups PXG2 may be alternately arranged along the first directional axis DR1.

One second color light emitting area PXA2 may be spaced apart from one first color light emitting area PXA1 or one third color light emitting area PXA3 along the fourth directional axis DR4. The fourth directional axis DR4 may be a direction between the first directional axis DR1 and the second directional axis DR2.

The arrangement structure of the light emitting areas PXA1, PXA2, and PXA3 shown in FIG. 2 may be referred to as a PenTile structure. However, the arrangement structure of the light emitting areas PXA1, PXA2, and PXA3 in the display device DD according to an embodiment is not limited to the arrangement structure shown in FIG. 2. For example, in an embodiment, the light emitting areas PXA1, PXA2, and PXA3 may have a stripe structure in which a first color light emitting area PXA1, a second color light emitting area PXA2, and a third color light emitting area PXA3 are alternately arranged along the second directional axis DR2.

Referring to FIG. 3, the first display substrate 100 may include a first base layer BS1, a circuit layer CCL, and a light emitting element layer EL. The circuit layer CCL may be on the first base layer BS1. The circuit layer CCL may include a plurality of insulating layers, a plurality of conductive layers, and a semiconductor layer. The light emitting element layer EL may be on the circuit layer CCL.

The first base layer BS1 may be a silicon substrate, a plastic substrate, a glass substrate, an insulating film, or a laminated structure including a plurality of insulating layers.

The circuit layer CCL may include first transistor TR1, the second transistor TR2, and the third transistor TR3 and a plurality of insulating layers IL1, IL2, IL3 and IL4. The plurality of insulating layers IL1, IL2, IL3 and IL4 includes a first insulating layer IL1, a second insulating layer IL2, a third insulating layer IL3, and a fourth insulating layer IL4.

The first insulating layer IL1 may be on the first base layer BS1 and the first transistor TR1, the second transistor TR2, and the third transistor TR3 may be on the first insulating layer IL1. Because the first transistor TR1, the second transistor TR2, and the third transistor TR3 may have substantially the same (e.g., substantially the same) structure, the content of the first transistor TR1 described below may be applied as it is. The first transistor TR1 may include a control electrode CE, an input electrode IE, an output electrode OE, and a semiconductor layer ACL.

The semiconductor layer ACL may be on the first insulating layer IL1. The first insulating layer IL1 may be a buffer layer that provides a reformed surface to the semiconductor layer ACL. In this case, the semiconductor layer ACL may have a higher adhesion to the first insulating layer IL1 than the first base layer BS1. In addition, the first insulating layer IL1 may be a barrier layer for protecting the lower surface of the semiconductor layer ACL. In this case, the first insulating layer IL1 may block the penetration of dirt, moisture, etc., which are from the first base layer BS1 itself or enter through the first base layer BS1, into the semiconductor layer ACL. Alternatively, the first insulating layer IL1 may be a light blocking layer blocking external light incident through the first base layer BS1 from entering the semiconductor layer ACL. In this case, the first insulating layer IL1 may further include a light blocking material.

The semiconductor layer ACL may include polysilicon or amorphous silicon. In addition, the semiconductor layer ACL may include a metal oxide semiconductor. The semiconductor layer ACL may include a channel area serving as a passage through which electrons or holes may travel, and a first ion-doped area and a second ion-doped area between the channel areas.

The second insulating layer IL2 is on the first insulating layer IL1 and may cover the semiconductor layer ACL. The second insulating layer IL2 may include an inorganic material. The inorganic material may include at least one of a silicon nitride, a silicon oxynitride, a silicon oxide, a titanium oxide, or an aluminum oxide.

A control electrode CE may be on the second insulating layer IL2. The third insulating layer IL3 is on the second insulating layer IL2 and may cover the control electrode CE. The third insulating layer IL3 may be composed of a single layer or a plurality of layers. For example, the single layer may include an inorganic layer. The plurality of layers may be provided by stacking an organic layer and an inorganic layer.

The input electrode IE and the output electrode OE may be on the third insulating layer IL3. Each of the input electrode IE and the output electrode OE may be connected to the semiconductor layer ACL through the through holes passing through the second insulating layer IL2 and the third insulating layer IL3.

The fourth insulating layer IL4 is on the third insulating layer IL3 and may cover the input electrode IE and the output electrode OE. The fourth insulating layer IL4 may be composed of a single layer or a plurality of layers. For example, the single layer may include an organic layer. The plurality of layers may be provided by stacking an organic layer and an inorganic layer. The fourth insulating layer IL4 may be a planarization layer providing a flat surface on the upper part. A light emitting element layer EL may be on the fourth insulating layer IL4.

The light emitting element layer EL may include a first light emitting element ELD1, a second light emitting element ELD2, a third light emitting element ELD3, a pixel defining film PDL, and a thin film sealing layer TFE on the light emitting elements ELD. Thin film sealing layer TFE may seal light emitting elements ELD. In some embodiments, a capping layer covering the second electrodes EL2 may be further between the thin film sealing layer TFE and the second electrodes EL2. In this case, the thin film sealing layer TFE may directly cover the capping layer. In an embodiment, the thin film sealing layer TFE may be omitted.

The first light emitting element ELD1 may include a first electrode EL1, a hole transport area HTR on the first electrode EL1, a first light emitting layer EML1 on the hole transport area HTR, an electron transport area ETR on the first light emitting layer, and a second electrode EL2. Each of the second light emitting element ELD2 and the third light emitting element ELD3 may have substantially the same description as the first light emitting element ELD1 except that each includes a second light emitting layer EML2 and a third light emitting layer EML3, respectively.

The first electrode EL1 may be on the fourth insulating layer IL4. The first electrode EL1 has conductivity. The first electrode EL1 may be formed of a metal alloy or a conductive compound. The first electrode EL1 may be an anode. In addition, the first electrode EL1 may be a pixel electrode. The first electrode EL1 may be a transmissive electrode, a semi-transmissive electrode, or a reflective electrode. Each of the first electrodes EL1 may be electrically connected to the first transistor TR1, the second transistor TR2, and the third transistor TR3 through the through holes in a one-to-one correspondence manner. For example, the first electrode EL1 of the first light emitting element ELD1 may be electrically connected to the first transistor TR1. The first electrode EL1 of the second light emitting element ELD2 may be electrically connected to the second transistor TR2. The first electrode EL1 of the third light emitting element ELD3 may be electrically connected to the third transistor TR3.

The hole transporting area HTR may include at least one of a hole injection layer, a hole transport layer, a hole block layer, or an electron block layer. The hole transport area HTR may have a single layer made of a single material, a single layer made of a plurality of different materials, or a multilayer structure having a plurality of layers made of a plurality of different materials. The material of the hole transport area HTR is not particularly limited and may include suitable material available in the art.

The light emitting layers EML1, EML2, and EML3 may have a single layer of a single material, a single layer of a plurality of different materials, or a multilayer structure having a plurality of layers of a plurality of different materials.

The light emitting layers EML1, EML2, and EML3 may include an amorphous carbon light emitter CQD. Referring to FIG. 4, the amorphous carbon light emitter CQD may include a core part CR and branch parts FG bonded to the surface of the core part. The area where the branch part FG is located may be defined as the branch area FGA. The branch area FGA may be defined as a quasi-spherical shape with a bend on a virtual spherical or spherical surface.

The core part CR may be a light emitting part that emits light, and the branch part FG may be a non-light emitting part that does not emit light.

The core part CR may be spherical, or may be quasi-spherical with a bend on the surface of the spherical surface. However, the embodiment is not limited thereto, and may have a shape such as a pyramid, a multi-arm or cubic nanoparticle, a nanotube, a nanowire, a nanofiber, or a nanoplate-like particle. The amorphous carbon light emitter CQD may be a Quantum dot light emitter having a size (e.g., a diameter L1) of 1.50 nm or more and 1.65 nm or less. The size (e.g., diameter L1) of the amorphous carbon light emitter CQD may be defined as the diameter of the core part CR. If the core part CR is not spherical, the diameter of the core part CR may be a straight line passing through the center of gravity of the core part CR, and may mean the average length of the segments coupling two points on the perimeter of the core part CR. As used herein, the term "size" may refer to a particle size of the core part CR, such as an average particle size, for example, D50, which refers to a diameter at which half of the particles by mass of a sample have a larger diameter and the other half of the particles by mass of the sample have a smaller diameter.

The core part CR may include a hydrocarbon group. For example, the core part CR may include a polymeric hydrocarbon polymer. In some embodiments, it may include a hydrocarbon polymer composed of acrylamide compounds such as polyacrylamide or acrylate compounds such as polymethylmethacrylate. In another example, the core part CR may include an aromatic ring derivative. For example, it may include a phenyl derivative such as diamine benzene, pyrene, phenanthroline, or trimethylbenzene. However, the embodiment is not limited thereto, and the core part CR may include another hydrocarbon group and may further include a hetero atom.

The core part CR may have an amorphous structure. For example, the hydrocarbon groups and the like in the core part CR may be irregularly bonded to each other to form an amorphous structure.

The branch part FG may be composed of a functional group. The branch part FG may be a hydrocarbon derivative including an alkyl group, an alkenyl group, an alkynyl group, an amine group, a thiol group, a hydroxyl group, an ether group, an ester group, a hydrazine group, a carboxyl group, an amide group, or a carbonyl group. For example, the branch part FG may be composed of the above-mentioned functional group or a combination of the above-mentioned functional groups, or one or more of the functional groups bonded to a main chain of the hydrocarbon.

However, the embodiment is not limited thereto, and the branch parts FG may include other functional groups.

Referring again to FIGS. 2 and 3, the first light emitting layer EML1 may include a first amorphous carbon light emitter CQD1. The second light emitting layer EML2 may include a second amorphous carbon light emitter CQD2. The third light emitting layer EML3 may include a third amorphous carbon light emitter CQD3.

The diameter of the first amorphous carbon light emitter CQD1 may be smaller than the diameter of the second amorphous carbon light emitter CQD2, and the diameter of the second amorphous carbon light emitter CQD2 may be less than the diameter of the third amorphous carbon light emitter CQD3.

The light emitting wavelengths of the first to third amorphous carbon light emitters CQD may be determined by the diameters of the first to third amorphous carbon light emitters CQD.

For example, the first amorphous carbon light emitter CQD1 emits blue light and may have a diameter of 1.50 nm or more and 1.65 nm or less. The second amorphous carbon light emitter CQD2 emits green light and may have a diameter of 1.66 nm or more and 2.00 nm or less. The third amorphous carbon light emitter CQD3 emits red light and may have a diameter of 2.10 nm or more and 3.00 nm or less. However, the light emitting wavelength of the first to third amorphous carbon light emitters CQD is not limited only by the diameters of the first to third amorphous carbon light emitters CQD.

In an embodiment, the light emitting wavelength may be additionally adjusted by adjusting the type (or kind) of functional groups included in the branch part FG of the first to third amorphous carbon light emitters CQD. For example, the light emitting wavelength may be changed depending on the types (or kinds) of functional groups included in the branch part FG of the first to third amorphous carbon light emitters CQD. In some embodiments, when the branch part has an oxygen including group such as a hydroxyl group, an ether group, an ester group, a carboxyl group, a carbonyl group, or an ester group, the light emitting wavelength may be changed. In an embodiment, the light emitting wavelength of the first to third amorphous carbon light emitters CQD may be adjusted by adjusting the roughness of the surfaces of the first to third amorphous carbon light emitter CQD. For example, the light emitting wavelength may be changed by adjusting the roughness of the surface of the first to third amorphous carbon light emitters CQD, a planarization process, and the like.

The amorphous carbon light emitters CQD may be synthesized in a variety of ways. For example, it may be synthesized by the following method.

(Synthesis of Amorphous Carbon Light Emitter CQD)

A polyacrylamide aqueous solution of (1 ml, 90 wt % in water) and nitric acid (0.5 M, 1 ml) were mixed with oleylamine (10 ml) and stirred for 30 minutes under an argon atmosphere to form an emulsion. The formed emulsion was heated to 250° C. for 2 hours under an argon (Ar) atmosphere and then cooled to room temperature. The generated solution was precipitated in methanol and centrifuged at 3000 rpm for 10 minutes to obtain a precipitate.

The obtained precipitate was dispersed in hexane, precipitated in methanol, and separated by centrifugation. In order to remove impurities, this process was repeated three times to obtain the final product.

The CQD may be synthesized utilizing various suitable hydrocarbon compounds and amorphous carbon light emitters CQD having various suitable sizes by changing the kind, molecular weight, and concentration of polymer, and changing reaction conditions.

In addition to the above-described synthesis method, an amorphous carbon light emitter CQD may be manufactured by treating an amorphous carbon substrate by a physico-chemical method such as chemical ablation, laser ablation, or microwave irradiation.

In FIG. 3, the first light emitting layer EML1, the second light emitting layer EML2, and the third light emitting layer EML3 are shown to include an amorphous carbon light emitter CQD, but the embodiment is not limited thereto and further details thereof will be described herein below.

The electron transport area ETR is provided on a light emitting layer EML. The electron transport area ETR may include at least one of a hole block layer, an electron transport layer, and an electron injection layer, but the embodiment is not limited thereto. The electron transport area ETR may have a single layer made of a single material, a single layer made of a plurality of different materials, or a multilayer structure having a plurality of layers made of a plurality of different materials. The material of the electron transport area ETR is not particularly limited and may include any suitable material available in the art.

The second electrode EL2 is provided on the electron transport area ETR. The second electrode EL2 may be a common electrode or a cathode. The second electrode EL2 may be a transmissive electrode, a semi-transmissive electrode, or a reflective electrode.

The pixel defining film PDL may be between the light emitting elements ELD and expose at least a portion of each of the first electrodes EL1. The pixel defining film PDL may be formed of a polymer resin. For example, the pixel defining film PDL may be formed including a polyacrylate resin or a polyimide resin. In addition, the pixel defining film PDL may be formed further including an inorganic material in addition to the polymer resin. On the other hand, the pixel defining film PDL may be formed including a light absorbing material, or may be formed including a black pigment or a black dye. The pixel defining film PDL formed with a black pigment or a black dye may implement a black pixel defining film. In forming the pixel defining film PDL, a carbon black may be used as a black pigment or a black dye, but the embodiment is not limited thereto.

In addition, the pixel defining film PDL may be formed of an inorganic material. For example, the pixel defining film PDL may be formed of silicon nitride (SiNx), silicon oxide (SiOx), silicon oxynitride (SiOxNy), or the like.

Figure 5:
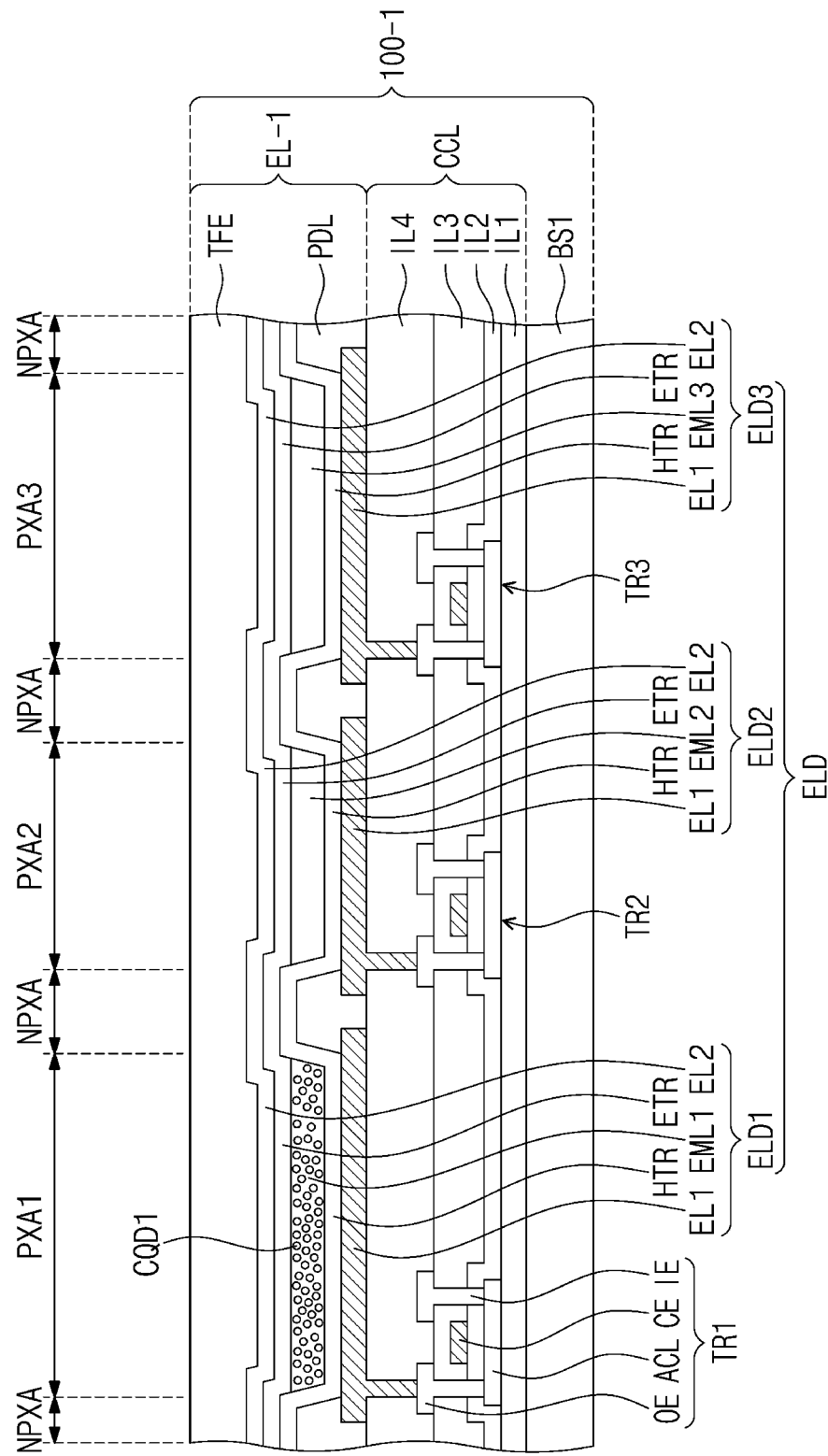
FIGS. 5 and 6 are cross-sectional views of a first display substrate according to an embodiment.
Figure 6:
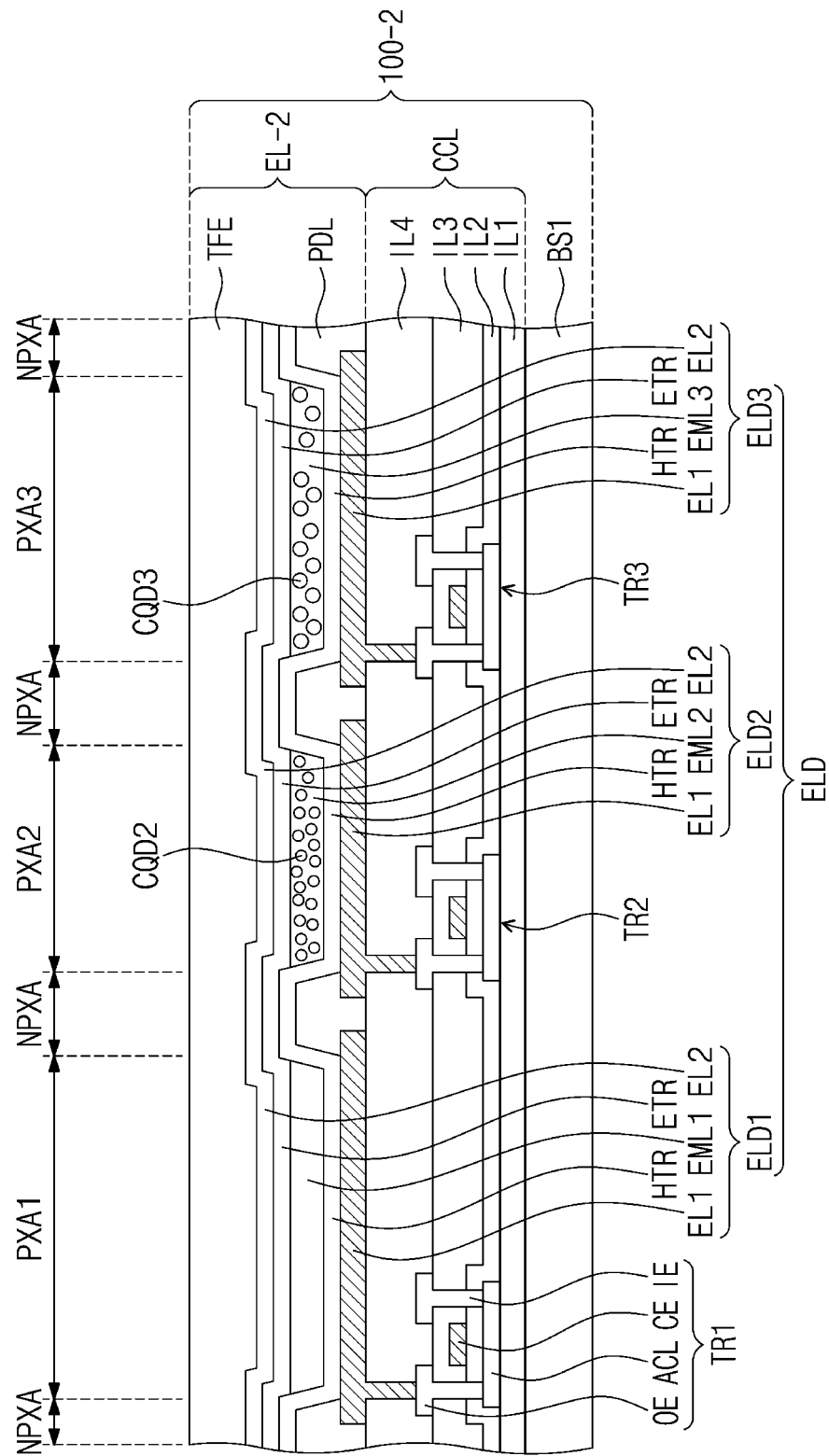

FIGS. 5 and 6 are cross-sectional views of the first display substrates 100-1 and 100-2 according to an embodiment. The cross-sectional views of FIGS. 5 and 6 may correspond to the cross-section taken along the line I-I' shown in FIG. 1, and FIGS. 5 and 6 include a light emitting element layer EL-1 and a light emitting element layer EL-2, respectively.

Referring to FIG. 5, the first light emitting layer EML1 of the first light emitting element ELD1 may include a first amorphous carbon light emitter (CQD1), and may emit the first color light. The first color light may be a blue light. Existing cadmium (Cd)-based quantum dot light emitters are harmful to the human body and have limited use due to their resultant environmental pollution. Quantum dot light emitters of other minerals are difficult to synthesize into light emitters that emit blue wavelengths of light. The amorphous carbon light emitter (CQD) of an embodiment may be easily synthesized as a blue quantum dot light emitter that is environmentally friendly and emits blue wavelengths of light. In addition, because the material cost is low, the manufacturing cost of the display device may be reduced.

The first light emitting layer EML1 may include only a first amorphous carbon light emitter CQD1. However, the embodiment is not limited thereto, and the first light emitting layer EML1 may further include another material. For example, it may further include a base resin.

In an embodiment, the second light emitting layer EML2 of the second light emitting element ELD2 may emit the second color light, and the third light emitting layer EML3 of the third light emitting element ELD3 may emit the third color light. The second color light may be green light, and the third color light may be red light.

In the display device of an embodiment, the first light emitting layer EML1 emitting blue light includes an amorphous carbon light emitter CQD. The second light emitting layer EML2 and the third light emitting layer EML3 may include a quantum dot light emitter including a material selected from a group II-VI compound, a group III-V compound, a group IV-VI compound, a group IV element, or a group IV compound other than amorphous carbon light emitter CQD.

The group II-VI compound may be selected from bivalent elements compound selected from the group consisting of ZnS, ZnSe, ZnTe, ZnO, HgS, HgSe, HgTe, MgSe, MgS, and compounds thereof, trivalent element compounds selected from the group consisting of AgInS, CuInS, ZnSeS, ZnSeTe, ZnSTe, HgSeS, HgSeTe, HgSTe, HgZnS, HgZnSe, HgZnTe, MgZnSe, MgZnS, and compounds thereof, and tetravalent element compounds selected from the group consisting of HgZnTeS, HgZnSeS, HgZnSeTe, HgZnSTe, and compounds thereof.

The group III-V compound may be selected from bivalent element compounds selected from the group consisting of GaN, GaP, GaAs, GaSb, AlN, AlP, AlAs, AlSb, InN, InP, InAs, InSb, and compounds thereof; trivalent element compounds selected from the group consisting of GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and compounds thereof; and tetravalent element compounds selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and compounds thereof. The group IV-VI compound may be selected from bivalent element compounds selected from the group consisting of SnS, SnSe, SnTe, PbS, PbSe, PbTe, and compounds thereof, trivalent element compounds selected from the group consisting of SnSeS, SnSeTe, SnSTe, PbSeS, PbSeTe, PbSTe, SnPbS, SnPbSe, SnPbTe, and compounds thereof, and tetravalent element compounds selected from the group consisting of SnPbSSe, SnPbSeTe, SnPbSTe, and compounds thereof. The group IV elements may be selected from the group consisting of Si, Ge, and compounds thereof. The IV group compound may be a bivalent element compound selected from the group consisting of SiC, SiGe, and compounds thereof.

At this time, the bivalent element compound, the trivalent element compound, or the tetravalent element compound may be present in the particle at a uniform (e.g., substantially uniform) concentration, or may be present in the same particle in a partially different concentration distribution state.

The quantum dot light emitters may be a core shell structure including a core and a shell surrounding the core. Also, a single quantum dot light emitter may have a core/shell structure that surrounds another quantum dot light emitter. The interface between the core and the shell may have a concentration gradient that is lowered as the concentration of the element in the shell approaches the core.

The shell of the quantum dots may serve as a protective layer for preventing or reducing chemical modification of the core to maintain semiconductor properties and/or may serve as a charging layer for providing electrophoresis properties to the quantum dot. The shell may be a single layer or multiple layers. The interface between the core and the shell may have a concentration gradient that is lowered as the concentration of the element in the shell approaches the core. Examples of the shells of the quantum dots may include oxides of metals or nonmetals, semiconductor compounds, or combinations thereof.

For example, the metal or nonmetal oxide may include a bivalent element compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and the like or a trivalent element compound such as $MgAl_2O_4$, $CoFe_2O_4$, $NiFe_2O_4$, $CoMn_2O_4$, and the like, but the present disclosure is not limited thereto.

In addition, the semiconductor compound may include ZnS, ZnSe, ZnTe, ZnSeS, ZnTeS, GaAs, GaP, GaSb, HgS, HgSe, HgTe, InAs, InP, InGaP, InSb, AlAs, AlP, AlSb, but the present disclosure is not limited thereto.

The quantum dot light emitters may be a particle having a nanometer scale size. The quantum dot light emitter may have a full width of half maximum (FWHM) of the light emitting wavelength spectrum of about 45 nm or less, about 40 nm or less, or, for example, about 30 nm or less, and in this range, color purity and color reproducibility may be improved. Further, because light emitted through the quantum dot light emitters is emitted in all directions, a wide viewing angle may be improved.

The shape of the quantum dot light emitters is not particularly limited, and may have any suitable form generally used in the art. For example, the quantum dot light emitters may be in the form of spherical, pyramidal, multi-arm or cubic nanoparticles, nanotubes, nanowires, nanofibers, nano platelike particles, and/or the like.

Referring to FIG. 6, rather than the amorphous carbon light emitter CQD, the first light emitting element ELD1 may include in the light emitting layer EML1 a quantum dot light emitter including a material selected from a group II-VI compound, a group III-V compound, a group IV-VI compound, a group IV element, or a group IV compound, and combinations thereof. The second light emitting element ELD2 and the third light emitting element ELD3 may include an amorphous carbon light emitter CQD. The second light emitting element ELD2 may include a second amorphous carbon light emitter CQD2 emitting green light, and the third light emitting element may include a third amorphous carbon light emitter CQD3 emitting red light.

In addition to those shown in FIGS. 5 and 6, it is apparent that any one or two of the first light emitting element ELD1, the second light emitting element ELD1, and the third light emitting element ELD3 may include an amorphous carbon light emitter CQD.

Figure 7:
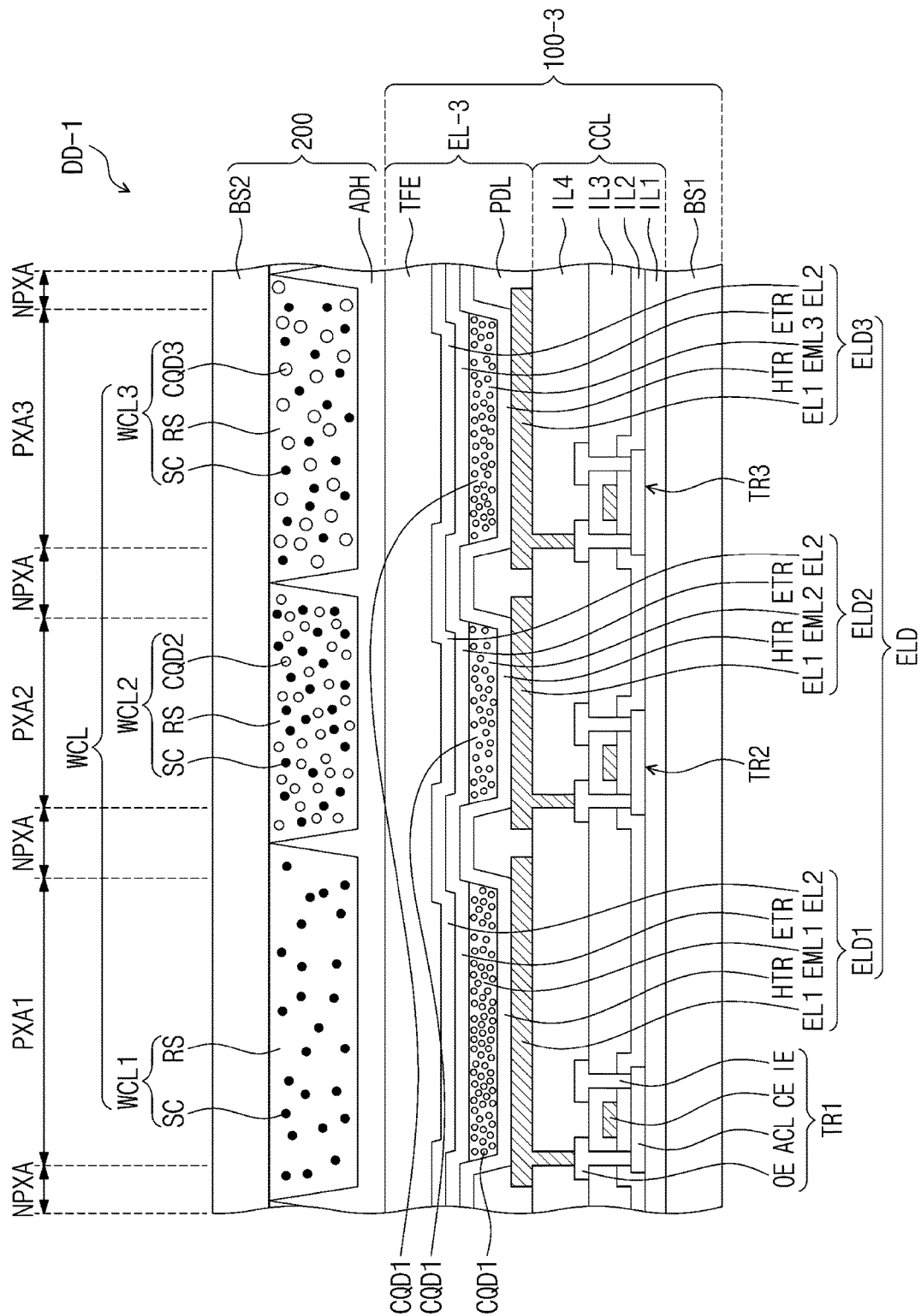
FIGS. 7 to 10 are cross-sectional views of a display device according to an embodiment.
Figure 8:
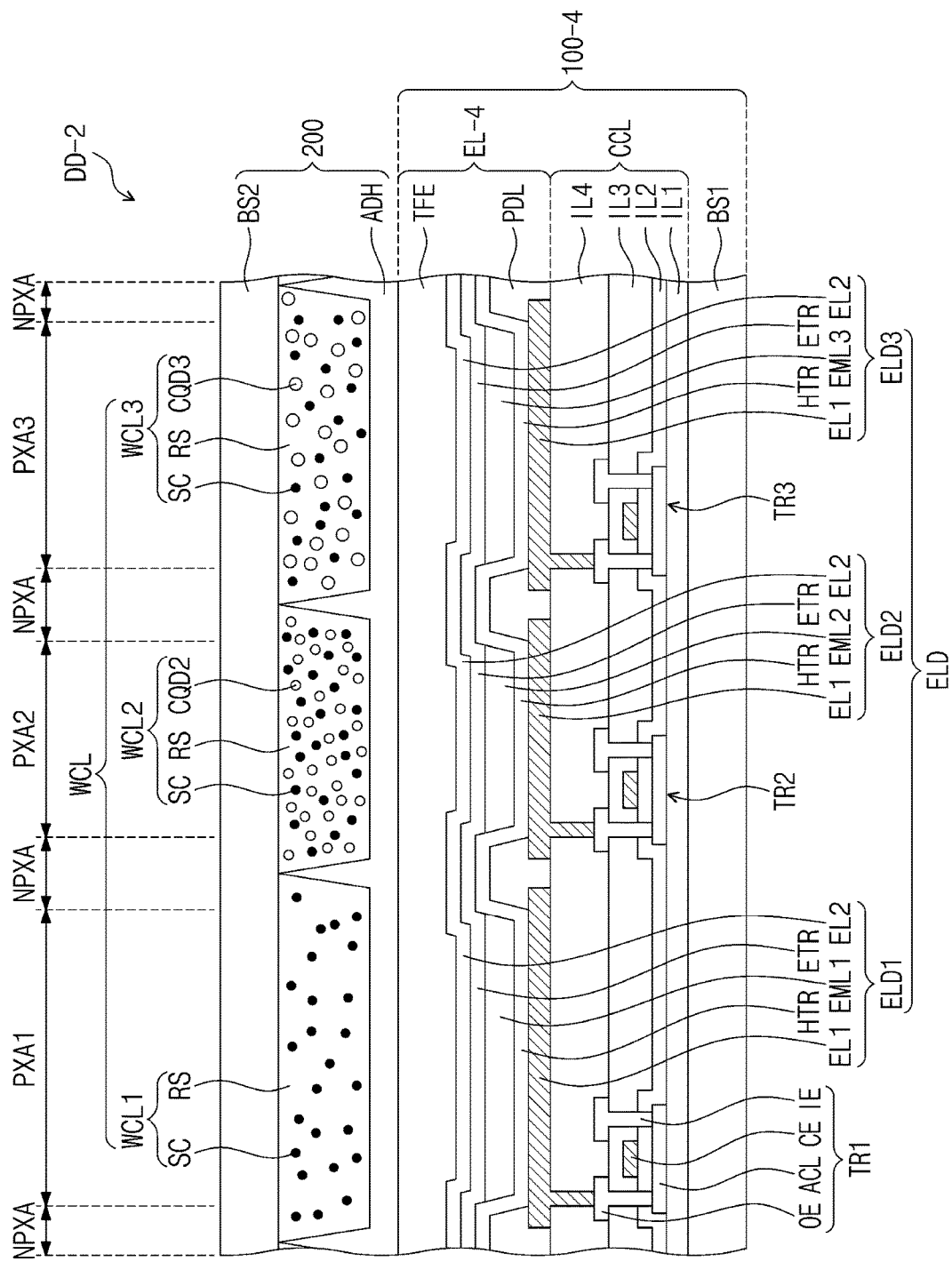

FIGS. 7 and 8 are cross-sectional views of display devices DD-1 and DD-2 according to an embodiment. Referring to FIG. 7, in the display device DD-1 of an embodiment, a second display substrate 200 may be on a first display substrate 100-3. The second display substrate 200 may include an adhesive member ADH, a light control layer WCL, a second base layer BS2, and a light emitting element layer EL-3.

For the first display substrate 100-3 according to an embodiment, substantially the same contents as those described with reference to FIGS. 3, 5, and 6 may be applied except that each of the light emitting layers EML1, EML2, and EML3 may emits the first color light. For example, each of the light emitting layers EML1, EML2, EML3 may include a first amorphous carbon light emitter CQD1 and emit blue light.

However, the embodiment is not limited thereto. Referring to FIG. 8, in the display device DD-2 of an embodiment, the light emitting elements ELD of the first display substrate 100-4 may be organic electric field light emitting elements including an organic material other than the light emitting element ELD including the quantum dot light emitter. The display device DD-2 includes a light emitting element layer EL-4.

In some embodiments, the first display substrate may emit ultraviolet light, and in this case, the first display substrate 100 may include a backlight and a liquid crystal layer.

The adhesive member ADH may be a member for attaching the first display substrate (e.g., the first display substrate 100-3 of FIG. 7 or the first display substrate 100-4 of FIG. 8) and the second display substrate 200 together. The adhesive member ADH may be an optically clear adhesive.

The second base layer BS2 may be on the adhesive member ADH. The second base layer BS2 may be a silicon substrate, a plastic substrate, a glass substrate, an insulating film, or a laminated structure including a plurality of insulating layers.

A light control layer WCL may be between the adhesion member ADH and the second base layer BS2. The light control layer WCL may include a first light control part WCL1, a second light control part WCL2, and a third light control part WCL3. The light control layer WCL may transmit the first color light emitted from the light emitting element layer EL or emit the second color light by absorbing the first color light or emit the third color light by absorbing the first color light. For example, the first light control part WCL1 may transmit the first color light. The second light control part WCL2 may absorb the first color light and emit the second color light. The third light control part WCL3 may absorb the first color light and emit the third color light. The first color light may be blue light, the second color light may be green light, and the third color light may be red light.

The first light control part WCL1 may overlap on a plane with the first color light emitting area PXA1 and may partially overlap with the non-light emitting area NPXA. The second light control part WCL2 may overlap on a plane with the second color light emitting area PXA2 and may partially overlap with the non-light emitting area NPXA. The third light control part WCL3 may overlap on a plane with the third color light emitting area PXA3 and may partially overlap with the non-light emitting area NPXA.

The first light control part WCL1 may include a base resin RS and a scatterer (e.g., scattering particles SC) dispersed in the base resin RS. The scattering particles SC may be TiO2 or silica-based nanoparticles. The scattering particles SC may scatter light. Because the first light control part (WCL1) does not include a light emitter, the amount of scattering particles SC per unit area included in the first light control part WCL1 may be greater than the amount of scattering particles SC per unit area included in each of the second light control part WCL2 and the third light control part WCL3. However, the embodiment is not limited thereto, and when ultraviolet light is emitted from the first display substrate, the first light control part WCL1 may include a first amorphous carbon light emitter CQD1. In this case, the first amorphous carbon light emitter CQD1 may absorb ultraviolet light and emit blue light.

The second light control part WCL2 may include a base resin RS, and scattering particles SC dispersed in the base resin RS and a second amorphous carbon light emitter CQD2. The second amorphous carbon light emitter CQD2 may absorb the first color light and emit the second color light.

The third light control part WCL3 may include a base resin RS, and scattering particles SC dispersed in the base resin RS and a third amorphous carbon light emitter CQD3. The third amorphous carbon light emitter CQD3 may absorb the first color light and emit the third color light.

In an embodiment, although it is described that all of the first light control part WCL1, the second light control part WCL2, and the third light control part WCL3 or the second light control part WCL2 and the second light control part WCL3 include an amorphous carbon light emitter CQD, the embodiment is not limited thereto. Any one or two of the first light control part WCL1, the second light control part WCL2, and the third light control part WCL3 may include an amorphous carbon light emitter CQD. In this case, the remaining light control part may include a quantum dot light emitter including a material selected from group II-VI compounds, group III-V compounds, group IV-VI compounds, group IV elements or group IV compounds, and compounds thereof.

Figure 9:
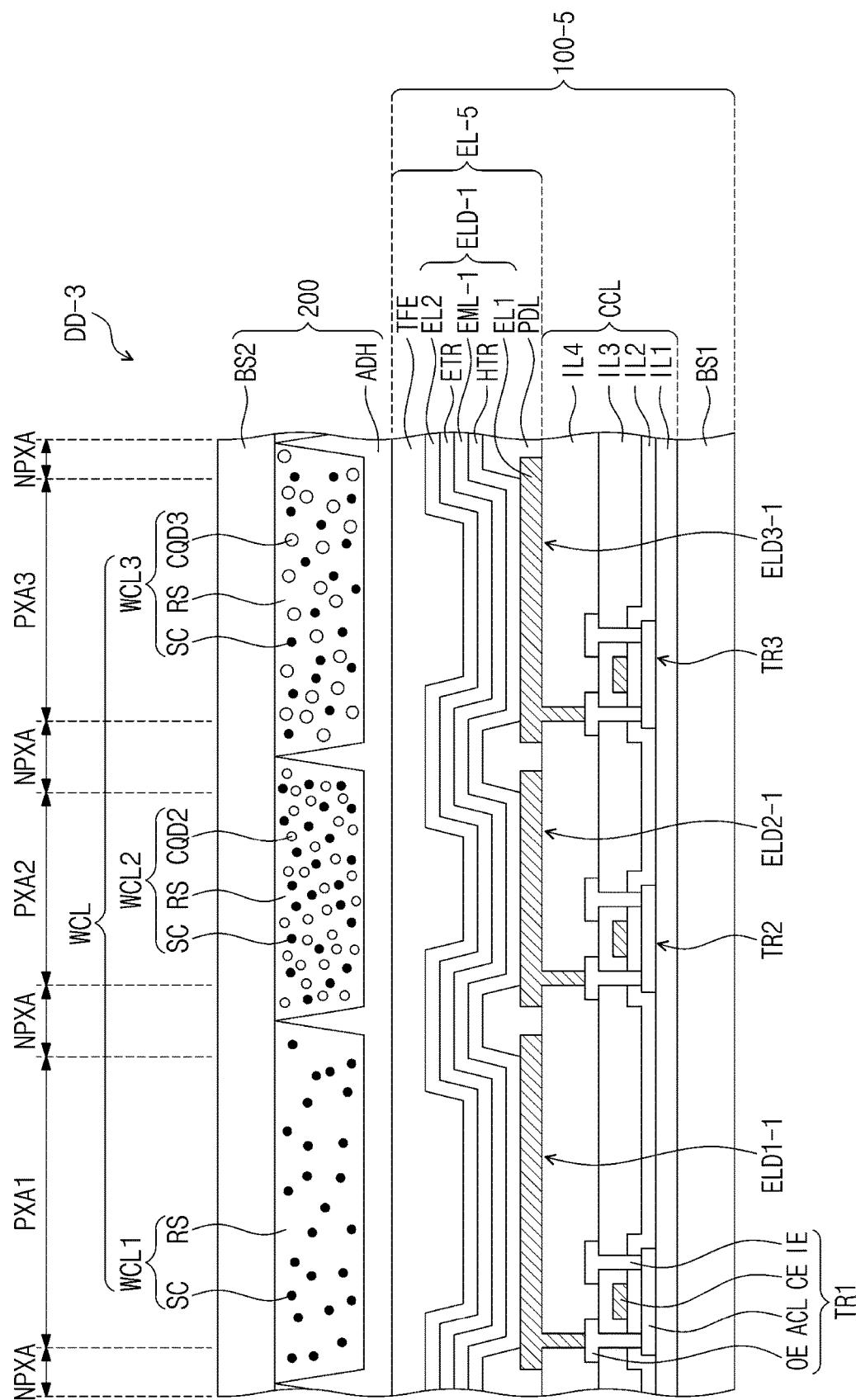

FIG. 9 is a cross-sectional view of a display device DD-3, including a first display substrate 100-5, according to an embodiment. Referring to FIG. 9, a light emitting layer EML-1 in a light emitting element ELD-1 of a light emitting element layer EL-5 may be a common layer in light emitting elements ELD1-1, ELD2-1, and ELD3-1. In this case, because a separate mask for depositing the light emitting layer EML-1 is not required, the manufacturing process of the display device DD-3 may be simplified.

The light emitting layer EML-1 of an embodiment may include a quantum dot light emitter. For example, it may include a first amorphous carbon light emitter CQD1. However, the embodiment is not limited thereto, and the light emitting layer EML-1 may include an organic material as a light emitting material.

Figure 10:
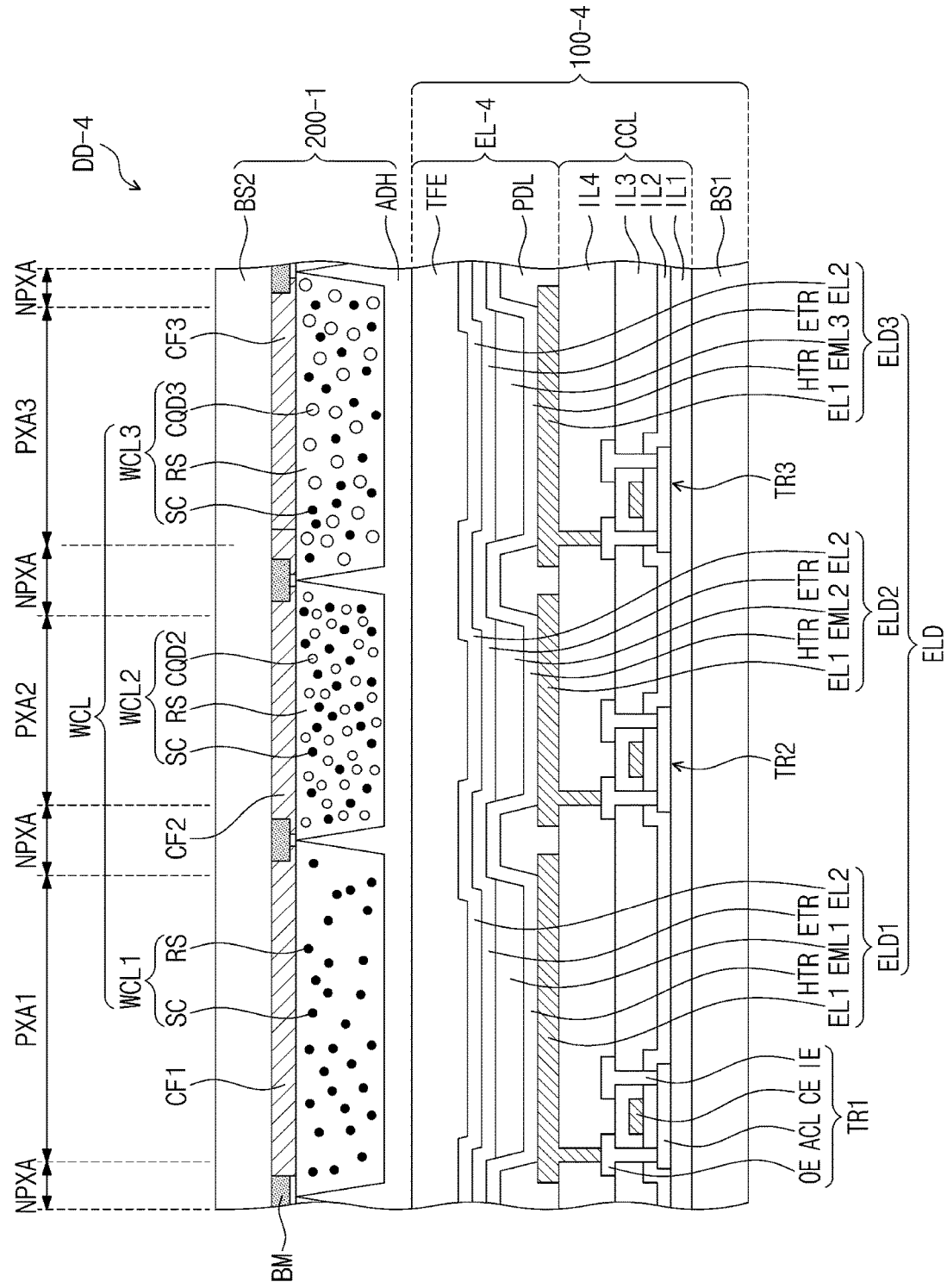

FIG. 10 is a cross-sectional view of a display device DD-4 according to an embodiment. Referring to FIG. 10, the display device DD-4 may include a first color filter CF1, a second color filter CF2, and a third color filter CF3. The first color filter CF1 may be on the first light control part WCL1 and may overlap the first light control part WCL1 on a plane. The second color filter CF2 may be on the second light control part WCL2 and may overlap the second light control part WCL2 on a plane. The third color filter CF3 may be on the third light control part WCL3 and may overlap the third light control part WCL3 on a plane.

Each of the first color filter CF1, the second color filter CF2, and the third color filter CF3 may transmit different wavelengths of light. For example, the first color filter CF1 may transmit the first color light and absorb the remaining light. The second color filter CF2 may transmit the second color light and absorb the remaining light. The third color filter CF3 may transmit the third color light and absorb the remaining light.

Each of the first color filter CF1, the second color filter CF2 and the third color filter CF3 may transmit color light corresponding to light emitted from the first light control layer WCL1, the second light control layer WCL2, and the third light control layer WCL3 and absorb the remaining light. The first color filter CF1 may be a blue color filter transmitting blue light. The second color filter CF2 may be a green color filter transmitting green light. The third color filter CF3 may be a red color filter transmitting red light.

The first color filter CF1, the second color filter CF2, and the third color filter CF3 include a base resin and may include at least one dye or pigment dispersed in the base resin. The first color filters CF1, the second color filter CF2, and the third color filter CF3 may include different kinds of dyes and pigments. For example, the first color filter CF1 may include at least one blue dye or blue pigment. The second color filter CF2 may include at least one green dye or green pigment. The third color filter CF3 may include at least one red dye or red pigment.

As the first color filter CF1, the second color filter CF2, and the third color filter CF3 are included, because only the light of the target wavelength region is emitted, the color reproducibility of the display device DD may be increased. In addition, because the external light reflection may be reduced by absorbing the light incident from the outside, the visibility of the display device DD-4 may be improved.

A second display substrate 200-1 includes light blocking layer BM may be between each of the first color filter CF1, the second color filter CF2, and the third color filter CF3. The light blocking layer BM may be directly on the lower part of the second base layer BS2. The light blocking layer BM may overlap the non-light emitting area NPXA on a plane. The light blocking layer BM may include carbon black particles. As the light blocking layer BM is included, the phenomenon that the light emitted from the adjacent pixel area is mixed may be prevented or reduced. In an embodiment, the light blocking layer BM may be omitted.

The display device according to an embodiment may include a light emitting element layer and a light control layer on the light emitting element layer. At least one of the light emitting element layer and the light control layer may include an amorphous carbon light emitter.

The display device according to an embodiment may include a light emitting element. The light emitting element may include a light emitting layer, and the light emitting layer may include an amorphous carbon light emitter.

According to an embodiment of the present disclosure, a display device including an environmentally friendly amorphous carbon light emitter may be provided.

According to an embodiment of the present disclosure, a display device including an amorphous carbon light emitter capable of emitting blue light may be provided.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although exemplary embodiments of the present disclosure have been described, it is understood that the present disclosure should not be limited to these exemplary embodiments but various changes and modifications may be made by one ordinary skilled in the art within the spirit and scope of the appended claims, and equivalents thereof.

What is claimed is:

1. A display device comprising:
   a light emitting element layer comprising a plurality of light emitting elements; and
   a light control layer on the light emitting element layer and overlapping the light emitting element layer on a plane,
   wherein at least one of the light emitting elements and the light control layer comprises an amorphous carbon light emitter, and
   wherein the plurality of light emitting elements comprise a first light emitting element emitting a first color light, a second light emitting element emitting a second color light, and a third light emitting element emitting a third color light, and
   wherein the first light emitting element comprises the amorphous carbon light emitter, and each of the second light emitting element and the third light emitting element comprises a quantum dot.

2. The display device of claim 1, wherein the first light emitting element comprises a first amorphous carbon light emitter having a size of 1.50 nm or more to 1.65 nm or less.

3. The display device of claim 1, wherein the first color light is blue light, the second color light is green light, and the third color light is red light.

4. A display device comprising a plurality of light emitting elements, each of the light emitting elements comprising:
- a first electrode;
- a hole transport area on the first electrode;
- a light emitting layer on the hole transport area;
- an electron transport area on the light emitting layer, and
- a second electrode on the electron transport area,
- wherein the plurality of light emitting elements comprise a first light emitting element emitting a first color light, a second light emitting element emitting a second color light, and a third light emitting element emitting a third color light, and
- wherein the light emitting layer of the first light emitting element comprises an amorphous carbon light emitter, and the light emitting layer of each of the second light emitting element and the third light emitting element comprises a quantum dot.

5. The display device of claim 4, wherein the first color light is blue light.

6. A display device comprising:
- a display substrate comprising a display area and a non-display area surrounding the display area, the display area comprising:
- a first color light emitting area, a second color light emitting area, and a third color light emitting area,
- wherein the display substrate further comprises a first light emitting element, a second light emitting element, and a third light emitting element respectively corresponding to the first color light emitting area, the second color light emitting area, and the third color light emitting area,
- wherein the first light emitting element comprises a light emitting layer comprising an amorphous carbon light emitter, and each of the second light emitting element and the third light emitting element comprises a light emitting layer comprising a quantum dot.

7. The display device of claim 6, wherein the first light emitting element emits blue light.

8. The display device of claim 6, wherein the amorphous carbon light emitter has a size of 1.50 nm or more and 1.65 nm or less.

* * * * *